(12) United States Patent
Nguyen

(10) Patent No.: US 6,853,698 B1
(45) Date of Patent: Feb. 8, 2005

(54) RIPPLE COUNTER CIRCUITS AND METHODS PROVIDING IMPROVED SELF-TESTING FUNCTIONALITY

(75) Inventor: Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/829,065

(22) Filed: Apr. 20, 2004

(51) Int. Cl.[7] ............................................ H03K 17/00
(52) U.S. Cl. ........................ 377/29; 377/31; 377/32; 377/104; 377/105
(58) Field of Search .................... 377/29, 31, 32, 377/104, 105

(56) References Cited

U.S. PATENT DOCUMENTS 5,526,390 A * 6/1996 Fucili ........................... 377/29

* cited by examiner

Primary Examiner—Margaret R. Wambach
(74) Attorney, Agent, or Firm—Lois D. Cartier

(57) ABSTRACT

A ripple counter circuit supports two modes of operation, a user mode and a test mode. In the user mode, the circuit functions as a standard ripple counter, counting in response to first edges (e.g., rising edges) on a clock input signal. In the test mode, the ripple counter circuit alternates between two states. In the first state, the bits all toggle from their initialization values to new values. In the second state, the circuit operates in the same fashion as the user mode. Therefore, the ripple counter circuit counts by one, returning all of the bits to their initialization values. This capability significantly simplifies the testing process, particularly for long ripple counters. Some embodiments of the invention include various control circuits coupled to provide an internal clock signal and/or an initialization signal.

28 Claims, 11 Drawing Sheets

RIPPLE COUNTER CIRCUITS AND METHODS PROVIDING IMPROVED SELF-TESTING FUNCTIONALITY

FIELD OF THE INVENTION

The invention relates to digital counter circuits. More particularly, the invention relates to a digital ripple counter circuit having a user mode and also having a test mode in which all stored bits are toggled in a single clock cycle.

BACKGROUND OF THE INVENTION

Ripple counter circuits are a well known type of counter circuit in which each stage of the circuit clocks the next stage. (Hence the name "ripple counter".) Because of the ripple functionality, these circuits typically operate at a slower clock rate than other digital counters. However, ripple counter circuits are also simple and require relatively little area to implement, which makes them a preferred choice in many low-speed applications.

FIG. 1 illustrates a well known ripple up counter circuit having N bits stored in flip-flops 101_0 through 101_N-1 and providing N output signals Q0 through Q(N-1). (In the present specification, the same reference characters are used to refer to terminals, signal lines, and their corresponding signals.) Flip-flop 101_0 implements a first stage of the counter circuit, and flip-flops 101_1 through 101_N-1 form the remaining stages of the ripple counter. Each flip-flop 101_0 through 101_N-1 is reset by reset input signal RST. The complementary data output signal QB from each flip-flop provides the data input signal D for that flip-flop. Flip-flop 101_0 is clocked by clock input signal CLK, and flip-flops 101_1 through 101_N-1 are each clocked by the complementary output signal QB from the previous stage.

The circuit of FIG. 1 operates as follows and as shown in Table 1. The least significant bit Q0 changes state with every low-to-high transition on clock input signal CLK. Each succeeding bit changes state whenever the QB value of the previous stage changes from a low value to a high value.

Referring now to Table 1, the circuit is initially reset, as shown in the first line of the table. All of the Q values (Q(N-1) through Q0) are low, and all of the QB values are high. At the next rising edge of clock input signal CLK (second line), bit Q0 changes state as a result of the rising clock edge. Signal Q0 goes high, and signal QB goes low. At the next rising clock edge (third line), signal Q0 goes low again, and signal Q0B transitions from a low value to a high value, clocking flip-flop 101_1 of the next stage. Thus, signal Q1 goes high, and signal Q1B goes low. This process continues, with changing values "rippling" up the counter from the least significant to the most significant bit.

The circuit illustrated in FIG. 1 is a ripple up counter circuit. It is clear from Table 1 that a ripple down counter circuit can be implemented in a very similar fashion, simply by providing the inverse output signals (e.g., Q0B, Q1B, Q2B . . . ).

One important attribute of a counter circuit is how easily the circuit can be tested, e.g., to verify the functionality of each bit when the circuit is included in an integrated circuit (IC). Each bit should be tested to ensure that the bit properly transitions both from a low to a high value, and from a high to a low value. The ripple counter circuit of FIG. 1 can take a long time to test, particularly when many bits are included in the counter. For example, looking at Table 1 it is clear that to cycle a 3-bit ripple counter circuit through every transition requires eight clock cycles. More generally, for an N-bit counter, the number of clock cycles required is 2N (two to the Nth power), where N is the number of bits in the counter circuit. By adding a set capability to the reset capability shown in FIG. 1, the test time can be reduced to 2(N-1) clock cycles. Note that for a 24-bit counter, 2**23 (over 8 million) clock cycles are still required.

One known method of reducing the test time of a ripple counter is to provide a test mode in which the counter is functionally broken up into two or more smaller counters, i.e., with shorter chains of ripple logic. FIG. 2 illustrates an N-bit ripple up counter circuit that can be tested as three smaller counters. Each stage of the counter circuit is implemented as shown in FIG. 1, except that the clock terminals of two flip-flops 101_N/3 and 101_2N/3 are driven by multiplexers 201 and 202, respectively. Each of multiplexers 201, 202 provides either the complementary data output signal QB from the previous stage (when signal TESTEN is low) or the clock input signal CLK (when signal TESTEN is high). Thus, when signal TESTEN is low, the circuit operates in the same fashion as the circuit of FIG. 1. When signal TESTEN is high, the circuit operates as three separate ripple up counters: a first counter including flip-flops 101_0 through 101_N/3-1; a second counter including flip-flops 101_N/3 through 101_2N/3-1; and a third counter including flip-flops 101_2N/3 through 101_N-1.

For a ripple up counter circuit with 24 bits, the method demonstrated in FIG. 2 reduces the test time to 28 or 256 clock cycles without set capability, or 27 or 128 clock cycles with set capability. This test time can be further reduced by adding more multiplexers and breaking the counter circuit into yet smaller pieces during testing. However, the added multiplexers both consume additional space and reduce the speed of operation for the counter circuit. Adding the set capability also requires added logic.

Another well known approach that leads to a very testable counter is to make the counter loadable, that is, to provide the capability of loading any desired value directly into the counter flip-flops. Given this capability in an up counter, for example, each bit can be tested for a high-to-low transition

TABLE 1

| | | | | | | | Change from 0 -> 1? | | | Toggle? | | |
|---|---|---|---|---|---|---|---|---|---|---|---|---|
| ... O2 | O1 | O0 | ... O2B | O1B | O0B | ... | O2B | O1B | O0B | ... O2 | O1 | O0 |
| 0 | 0 | 0 | 1 | 1 | 1 | | N | N | N | (reset) | | |
| 0 | 0 | 1 | 1 | 1 | 0 | | N | N | N | N | N | Y |
| 0 | 1 | 0 | 1 | 0 | 1 | | N | N | Y | N | Y | Y |
| 0 | 1 | 1 | 1 | 0 | 0 | | N | N | N | N | N | Y |
| 1 | 0 | 0 | 0 | 1 | 1 | | N | Y | Y | Y | Y | Y |
| 1 | 0 | 1 | 0 | 1 | 0 | | N | N | N | N | N | Y |
| 1 | 1 | 0 | 0 | 0 | 1 | | N | N | Y | N | Y | Y |
| 1 | 1 | 1 | 0 | 0 | 0 | | N | N | N | N | N | Y |
| 0 | 0 | 0 | 1 | 1 | 1 | | Y | Y | Y | Y | Y | Y |
| ... | | | ... | | | | ... | | | ... | | | simply by loading an all-ones value, providing a clock pulse, and watching for all zeros on the output terminals. Similarly, each bit can be tested for a low-to-high transition by loading a value that will cause the desired transition, providing a clock pulse, and watching the output value for that bit.

FIG. 3 illustrates a known 8-bit ripple up counter circuit that is fully loadable. The circuit of FIG. 3 includes 16 reset flip-flops (D-type) 300–307 and 340–347, 15 2-to-1 multiplexers 311–317 and 320–327, nine inverters 330–337 and 352, and a logical NAND gate 351. The data is loaded serially into an 8-bit register (flip-flops 340–347), then loaded in parallel from this register into the ripple counter that includes flip-flops 300–307. The parallel load is performed via multiplexers 320–327, under control of a parallel load control signal PLOADB. To perform the load signal PLOADB must be driven low, which only occurs when test enable signal TESTEN is high and parallel load control signal PLOAD is high. Thus, parallel load control signal PLOADB is provided by logical NAND gate 351, which is driven by signals TESTEN and PLOAD. Serial reset signal SRST is generated by inverter 352 from signal TESTEN.

A first stage of the counter circuit includes flip-flop 300, multiplexer 320, inverter 330, and flip-flop 340. Flip-flop 300 has a D data input terminal D0 driven by multiplexer 320, a clock input terminal CK driven by clock input signal CLK, a reset input terminal R driven by reset input signal RST, and a data output terminal Q that provides counter output signal Q0. Data output terminal Q also drives inverter 330, which provides the "1" input to multiplexer 320. The "0" input to multiplexer 320 is the Q data output signal SQ0 from flip-flop 340. Flip-flop 340 has a data input terminal D coupled to power high VDD, a clock input terminal CK coupled to receive serial clock signal SCLK, and a reset terminal coupled to receive serial reset signal SRST.

Each of the remaining stages of the counter circuit includes a flip-flop 301–307, a first multiplexer 321–327, a second multiplexer 311–317, an inverter 331–337, and a flip-flop 341–347. Each flip-flop 301–307 has a D data input terminal D1–D7 driven by first multiplexer 321–327, a CK clock input terminal CK1–CK7 driven by second multiplexer 311–317, a reset input terminal R driven by reset input signal RST, and a data output terminal Q that provides counter output signal Q1–Q7, respectively. Each second multiplexer 311–317 has a "0" input terminal coupled to receive the clock input signal CLK and a "1" input terminal coupled to receive the output signal from inverter 330–336 of a preceding stage. Each second multiplexer 311–317 also has a select terminal coupled to receive load signal PLOADB.

Each data output terminal Q also drives inverter 331–337, which provides the "1" input to first multiplexer 321–327, respectively. The "0" input to each first multiplexer 321–327 is the Q data output signal SQ1–SQ7 from flip-flop 341–347, respectively. Each first multiplexer 321–327 has a select terminal coupled to receive load signal PLOADB. Each flip-flop 341–347 has a data input terminal D coupled to receive the data output signal Q from the corresponding flip-flop of the previous stage, a clock input terminal CK coupled to receive serial clock signal SCLK, and a reset terminal coupled to receive serial reset signal SRST.

A significant drawback of the circuit of FIG. 3 is obvious from looking at the figure, that drawback being the relatively large size of the circuit. The circuit of FIG. 3 includes a large amount of extra logic and twice as many flip-flops as the circuit of FIG. 1, for example.

Therefore, it is desirable to provide ripple counter circuits and methods having improved testability, e.g., circuits and methods that can reduce the number of clock cycles required to test each bit without adding large amounts of additional logic.

SUMMARY OF THE INVENTION

The invention provides a ripple counter circuit that supports two modes of operation, a user mode and a test mode. In the user mode, the circuit functions as a standard ripple counter, counting in response to first edges (e.g., rising edges) on a clock input signal. In the test mode, the ripple counter circuit alternates between two states. In the first state, the bits all toggle from their initialization values to new values. In the second state, the circuit operates in the same fashion as the user mode. Therefore, the ripple counter circuit counts by one, returning all of the bits to their initialization values. This capability significantly simplifies the testing process, particularly for long ripple counters.

According to an exemplary embodiment of the invention, the ripple counter circuit includes an up counter and a control circuit. Each stage of the ripple counter circuit includes a storage element (e.g., a flip-flop) and a multiplexer. The storage element has an inverted output signal fed back to its own input terminal, e.g., the storage element can be a toggle flip-flop. The clock terminal of each storage element is driven by the associated multiplexer. In the user mode, the multiplexer selects the inverted output signal from the previous stage. Thus, in the user mode each stage is clocked by the complementary signal from the previous stage, as in a known ripple counter.

In the test mode, in a first state the multiplexer selects the true output signal from the previous stage, and in a second state the multiplexer selects the inverted output as in the user mode. The ripple counter circuit alternates between the two states, under the control of the control circuit. In the first state, each stage is clocked by the true signal from the previous stage. Therefore, when the storage element in the first stage toggles from its initial zero value to one, all of the storage elements in the subsequent stages sequentially change from their initial zero values to one as well. The ripple counter circuit then enters the second state, i.e., each multiplexer is controlled to select the complementary signal from the previous stage. At the next active clock edge, the circuit counts up by one, and each bit toggles from one back to zero.

Some embodiments of the invention include various additional circuits coupled to provide an internal clock signal and/or an initialization signal.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 1:
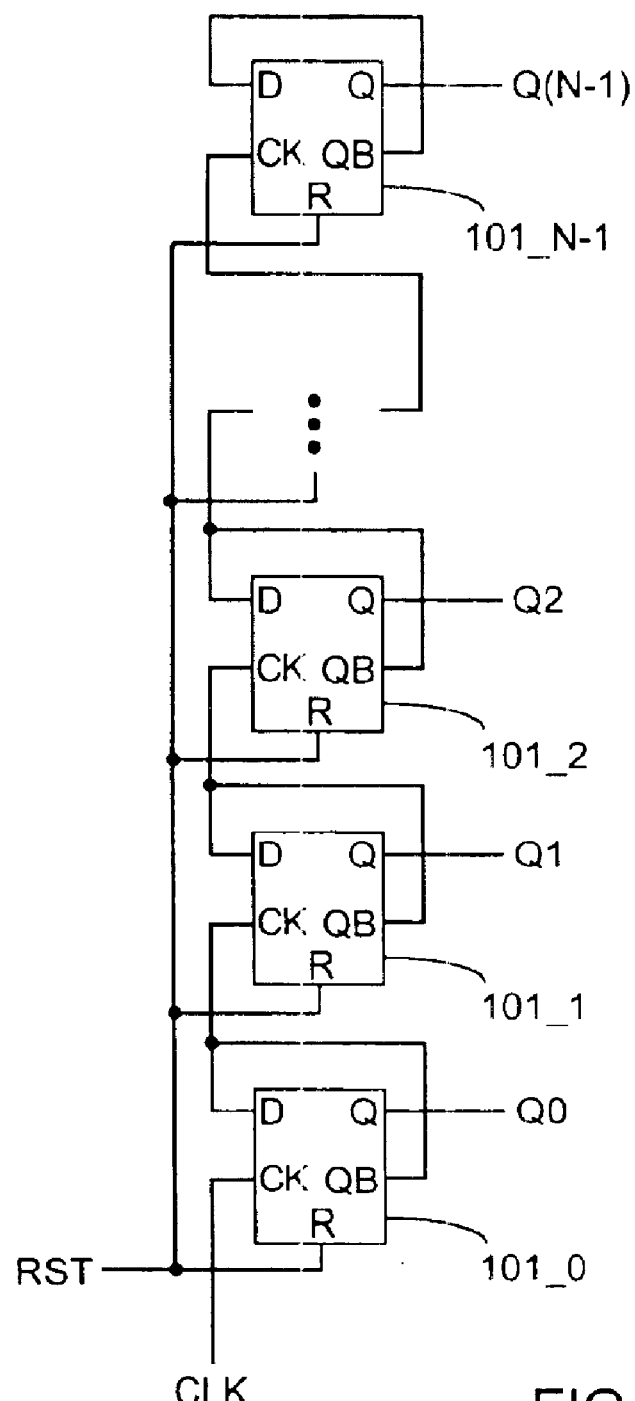
FIG. 1 illustrates a known ripple up counter circuit.
Figure 2:
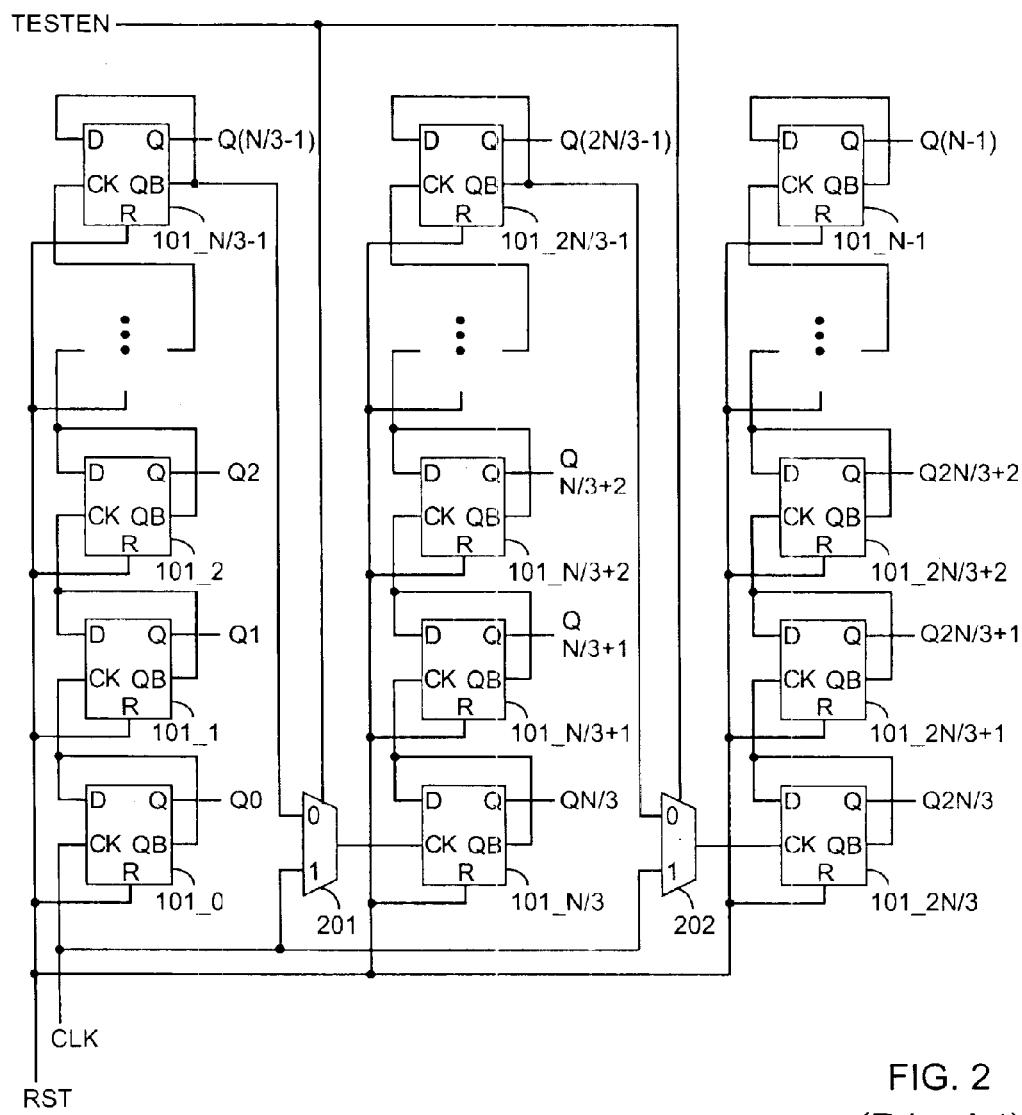
FIG. 2 illustrates a known ripple up counter circuit having a test mode in which the counter is effectively divided into three counters for testing.
Figure 3:
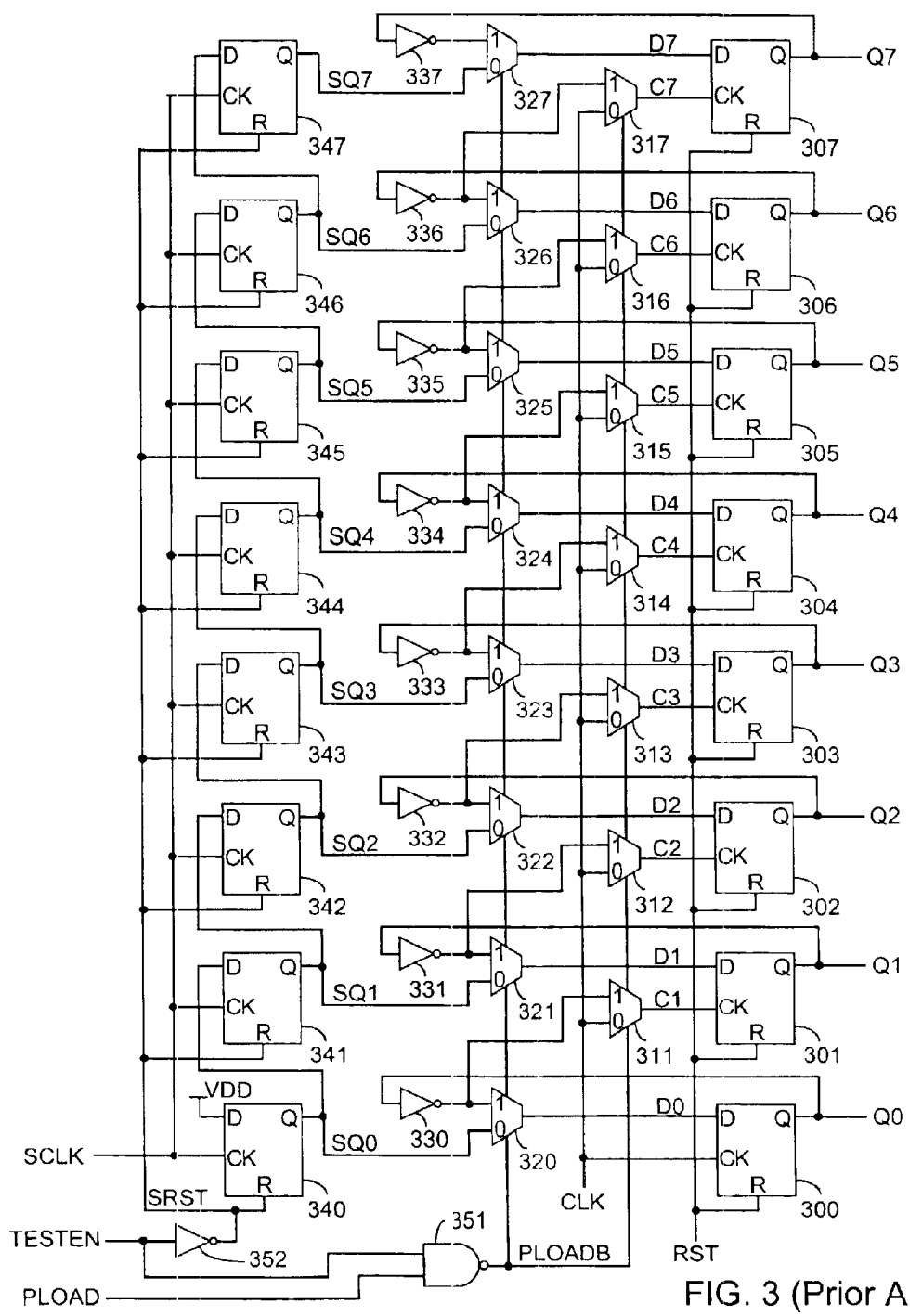
FIG. 3 illustrates a known loadable ripple up counter circuit.
Figure 4:
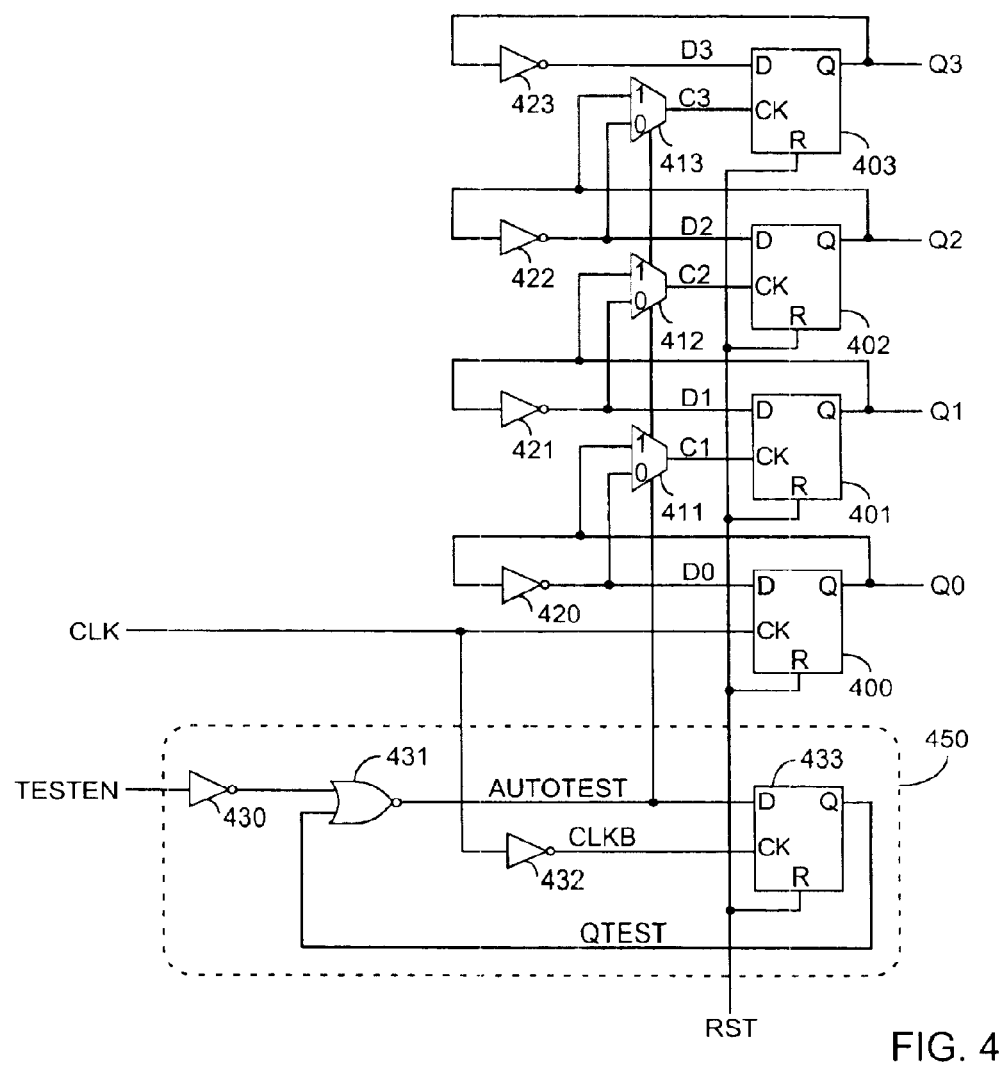
FIG. 4 illustrates a first testable ripple up counter circuit according to an embodiment of the present invention.

FIG. 4 illustrates a first testable ripple up counter circuit according to an embodiment of the present invention. The ripple counter circuit of FIG. 4 supports two modes of operation. In a user mode, signal TESTEN is low and drives signal AUTOTEST low. Therefore, the circuit functions in the same fashion as the ripple counter circuit of FIG. 1. In a test mode, signal TESTEN is high. Signal AUTOTEST is first driven high (e.g., in a first state), changing an all-zero value stored in flip-flops 400–403 to all ones in a single clock cycle after a rising edge on clock input signal CLK. Therefore, by resetting flip-flops 400–403 to all zeros, entering the first state (i.e., by driving signal AUTOTEST high), and providing a rising edge on clock input signal CLK, the value stored in the counter can be changed from all zeros to all ones in a single clock cycle. Signal AUTOTEST is then driven low, e.g., the circuit enters a second state. In the second state, the ripple counter circuit functions in the same way as in user mode. Therefore, another rising edge on clock input signal CLK causes the stored count value to increase by one, changing all of the values from ones back to zeros. Therefore, all bits can be tested simultaneously for each low-to-high transition, and again for each high-to-low transition. All bits can be tested in only two clock cycles, under the control of an automated control circuit (e.g., control circuit 450 in FIG. 4).

Note that the exemplary embodiments shown in FIGS. 4–9 illustrate 4-bit ripple counter circuits, for clarity. However, the principles of the invention can easily be applied to ripple counter circuits having other numbers of bits. Because of the difficulty of testing large ripple counter circuits, the invention has been particularly useful for implementing larger circuits, e.g., 24-bit ripple counter circuits.

The ripple up counter circuit of FIG. 4 includes reset flip-flops 400–403, multiplexers 411–413, inverters 420–423, and control circuit 450. Flip-flops 400–403 and inverters 420–423 together comprise a conventional 4-bit ripple up counter. A first stage of the counter circuit includes flip-flop 400 and inverter 420. Flip-flop 400 has a D data input terminal D0 driven by inverter 420, a clock input terminal CK driven by clock input signal CLK, a reset input terminal R driven by reset input signal RST, and a data output terminal Q that provides counter output signal Q0. Data output terminal Q also drives inverter 420.

Each of the remaining stages of the counter circuit includes a flip-flop 401–403, a multiplexer 411–413, and an inverter 421–423. Each flip-flop 401–403 has a D data input terminal D1–D3 driven by inverter 421–423, a CK clock input terminal C1–C3 driven by multiplexer 411–413, a reset input terminal R driven by reset input signal RST, and a Q data output terminal that provides counter output signal Q1–Q3, respectively. Each multiplexer 411–413 has a "1" input terminal coupled to the Q data output terminal Q0–Q2 of the preceding stage, a "0" input terminal coupled to the D data input terminal D0–D2 of the preceding stage, and a select terminal coupled to receive a control input signal AUTOTEST.

In the embodiment of FIG. 4, control input signal AUTOTEST is provided by control circuit 450. Note that the figures herein illustrate exemplary embodiments of the control circuit. However, the control circuit can be implemented in many different ways, and the invention is not limited to the exemplary implementations illustrated herein.

As illustrated in FIG. 4, control circuit 450 includes inverters 430 and 432, logical NOR gate 431, and reset flip-flop 433. Test enable input signal TESTEN drives inverter 430, which in turn drives logical NOR gate 431. The other input to logical NOR gate 431 is signal QTEST, and the output of logical NOR gate 431 is signal AUTOTEST. Inverter 432 is driven by clock input signal CLK and provides signal CLKB. Flip-flop 433 has a D data input terminal coupled to receive signal AUTOTEST, a CK clock input terminal coupled to receive signal CLKB, a reset input terminal coupled to receive signal RST, and a Q data output terminal providing signal QTEST.

Control circuit 450 functions as follows. Signal QTEST, the Q data output of flip-flop 433, is initially low due to the action of reset signal RST. When signal TESTEN is low (e.g., in the user mode), inverter 430 provides a high value to logical NOR gate 431, which drives a low value onto signal AUTOTEST. This low value is provided to the data input terminal D of flip-flop 433, maintaining the low value on signal QTEST. When signal TESTEN is high (e.g., in the test mode), logical NOR gate 431 functions as an inverter coupled between the Q data output terminal QTEST and the D data input terminal AUTOTEST of flip-flop 433. Therefore, the value of signal AUTOTEST toggles after each falling edge of clock input signal CLK. Thus, in test mode the circuit alternates between two states, a first state in which signal AUTOTEST is high, and a second state in which signal AUTOTEST is low.

The circuit of FIG. 4 can be tested, for example, by performing the following sequence of steps. Initially, signal RST is high, resetting each of flip-flops 400–403 and 433. The value stored in the counter is 0000. Signal TESTEN goes high, placing the circuit in test mode. (Signal TESTEN can go high either before or after applying a high value to signal RST.) Signal RST then goes low, followed by signal CLK going high, which clocks a high value into flip-flop 400 and hence onto signal Q0. Because signal AUTOTEST is high (provided by logical NOR gate 431 from a low value on signal QTEST and a high value on signal TESTEN), multiplexer 411 selects signal Q0 as the clock for flip-flop 401. (At this point, the ripple counter circuit is in the first state.) Thus, flip-flop 401 also toggles, as do the rest of the flip-flops in the ripple counter in a similar fashion. The new value stored in the counter is 1111.

When clock signal CLKB goes low, the high value on signal AUTOTEST is clocked into flip-flop 433, and signal QTEST goes high, driving signal AUTOTEST low again. At this point, the ripple counter circuit is in the second state. In other words, the low value on signal TESTENB is temporarily overridden by the high value on signal QTEST, and the ripple counter circuit of FIG. 4 returns to user mode. The low value on signal AUTOTEST selects each D data input signal D0–D2 as the clock input for the flip-flop 401–403 of the next stage. Because the stored value is 1111, each of the flip-flops toggles again, returning to the original value of 0000. Each bit in the ripple counter has toggled from zero to one, and back again, in only two cycles of input clock signal CLK.

If signal TESTEN remains high, the circuit returns to the first state at the next falling edge of clock input signal CLK, as the low value on signal AUTOTEST is clocked into flip-flop 433 and causes signal AUTOTEST to go high once again. The 0000 value changes to 1111, and then back to 0000 again, until signal TESTEN returns to a low value. This feature can be used, for example, to perform continuous tests under conditions of varying temperature and/or voltage.

The circuit of FIG. 4 requires less logic than known testable ripple counter circuits. For example, a ripple counter circuit according the present invention can be tested in only two clock cycles without adding a set function (if an up counter as in FIG. 4) or a reset function (if a down counter). If the inverter 420–423 is implemented as part of the flip-flop 400–403 (which is typically the case, because each flip-flop can normally provide signal QB as well as signal Q), the added logic constitutes only one multiplexer per stage. If the ripple counter is an up/down counter, multiplexers 411–412 are already present as the multiplexers needed to implement the up/down function, resulting in even more logic savings.

Figure 5:
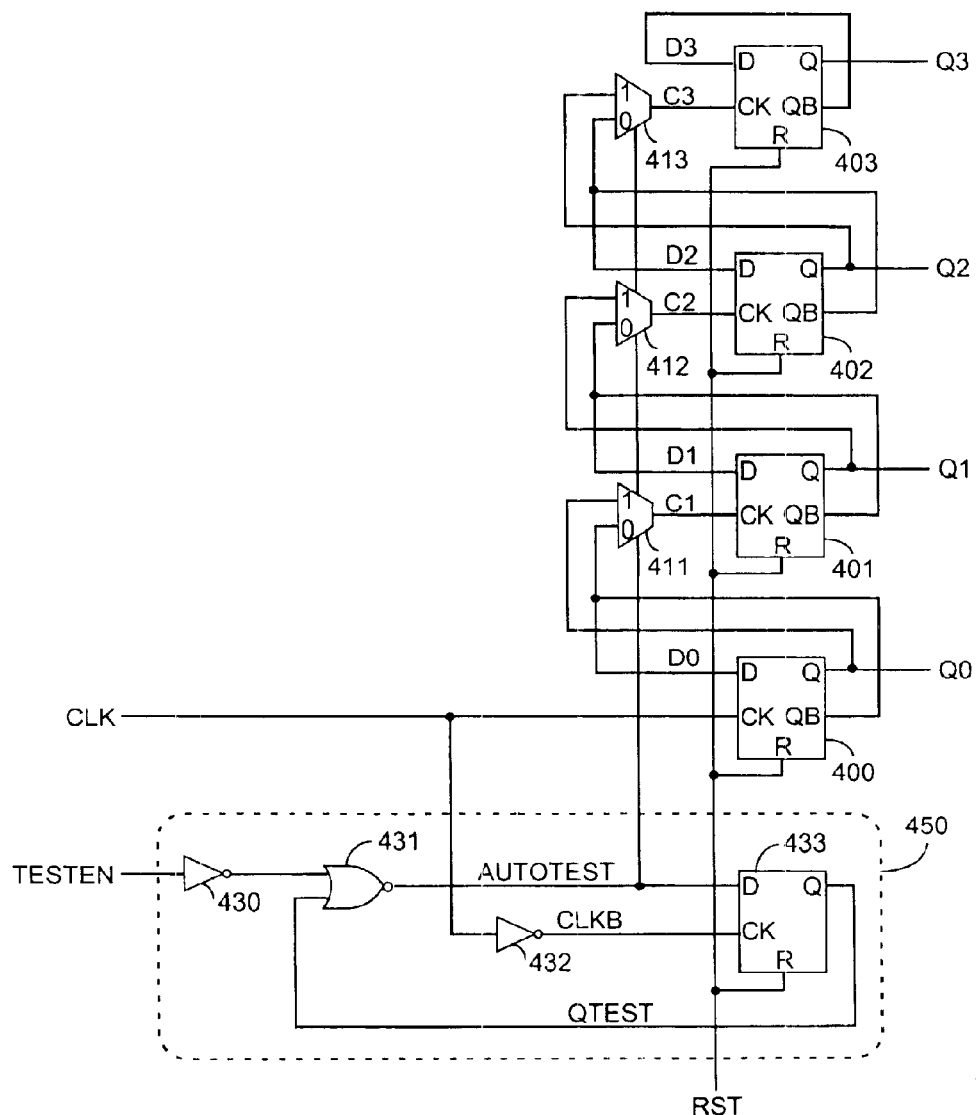
FIG. 5 illustrates a second testable ripple up counter circuit according to an embodiment of the present invention.

Clearly, there are many ways of implementing circuits having the functionality described herein with respect to FIG. 4. For example, FIG. 5 illustrates an embodiment similar to that of FIG. 4, but in which inverters 420–423 are omitted. (Other circuit elements similar to those of previous figures are similarly numbered but are not described again.) In the circuit of FIG. 5, instead of inverting the Q (true) data output signals from flip-flops 400–403, the QB (complementary) data output terminals are used to drive the D data input terminals and to drive the "0" input terminals of multiplexers 411–413. The circuit of FIG. 5 is logically equivalent to the circuit of FIG. 4. Each of the embodiments pictured in FIGS. 6–9 can be implemented using either of the two approaches illustrated in FIGS. 4 and 5. It will be apparent to one skilled in the art after reading this specification that the present invention can be practiced within this and other architectural variations.

Figure 6:
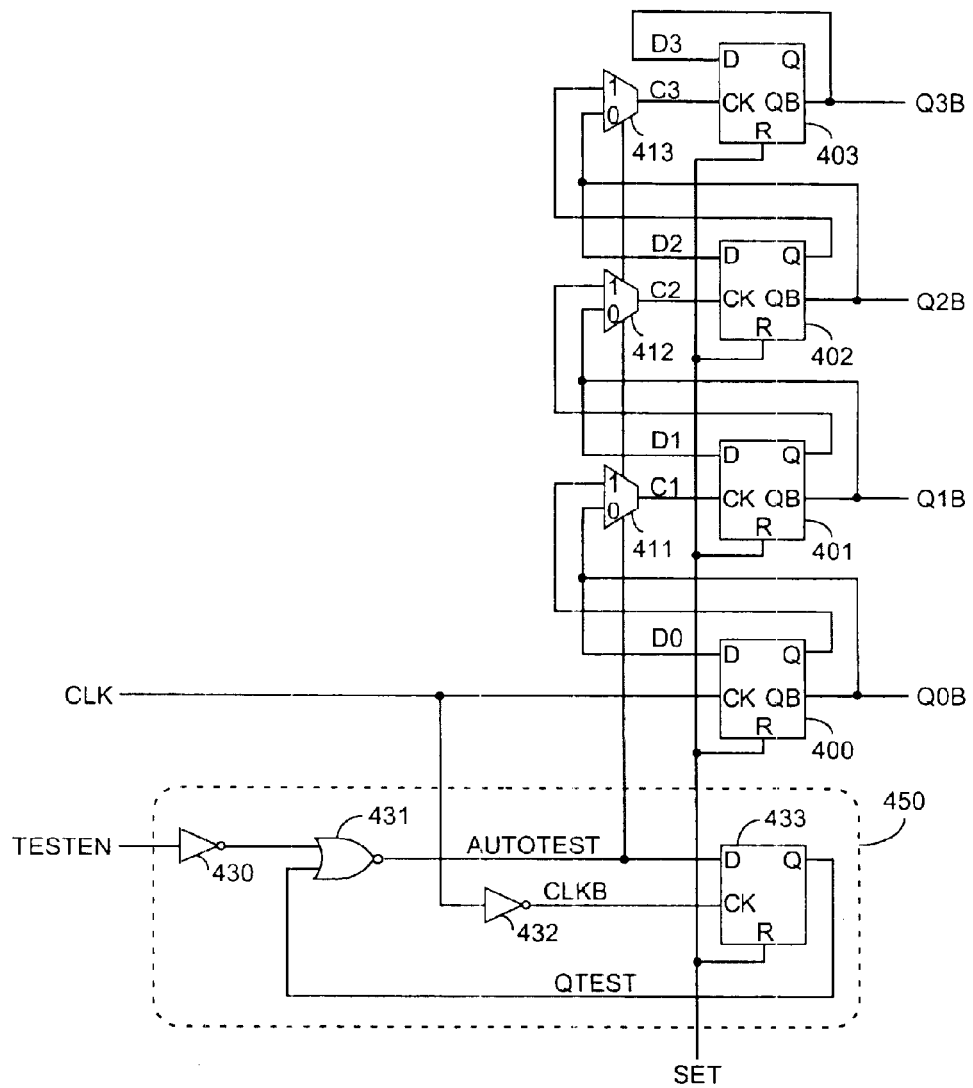
FIG. 6 illustrates a testable ripple down counter circuit according to an embodiment of the present invention.

FIG. 6 illustrates an embodiment in which the ripple counter circuit includes a down counter. As noted with regard to Table 1, above, a down counter can be implemented in the same fashion as an up counter simply by providing the four complementary (QB) output signals as the circuit output signals, as shown in FIG. 6. Note that the "reset" signal R for flip-flops 400–403 actually performs a set function with respect to output signals Q0B–Q3B.

Figure 6A:
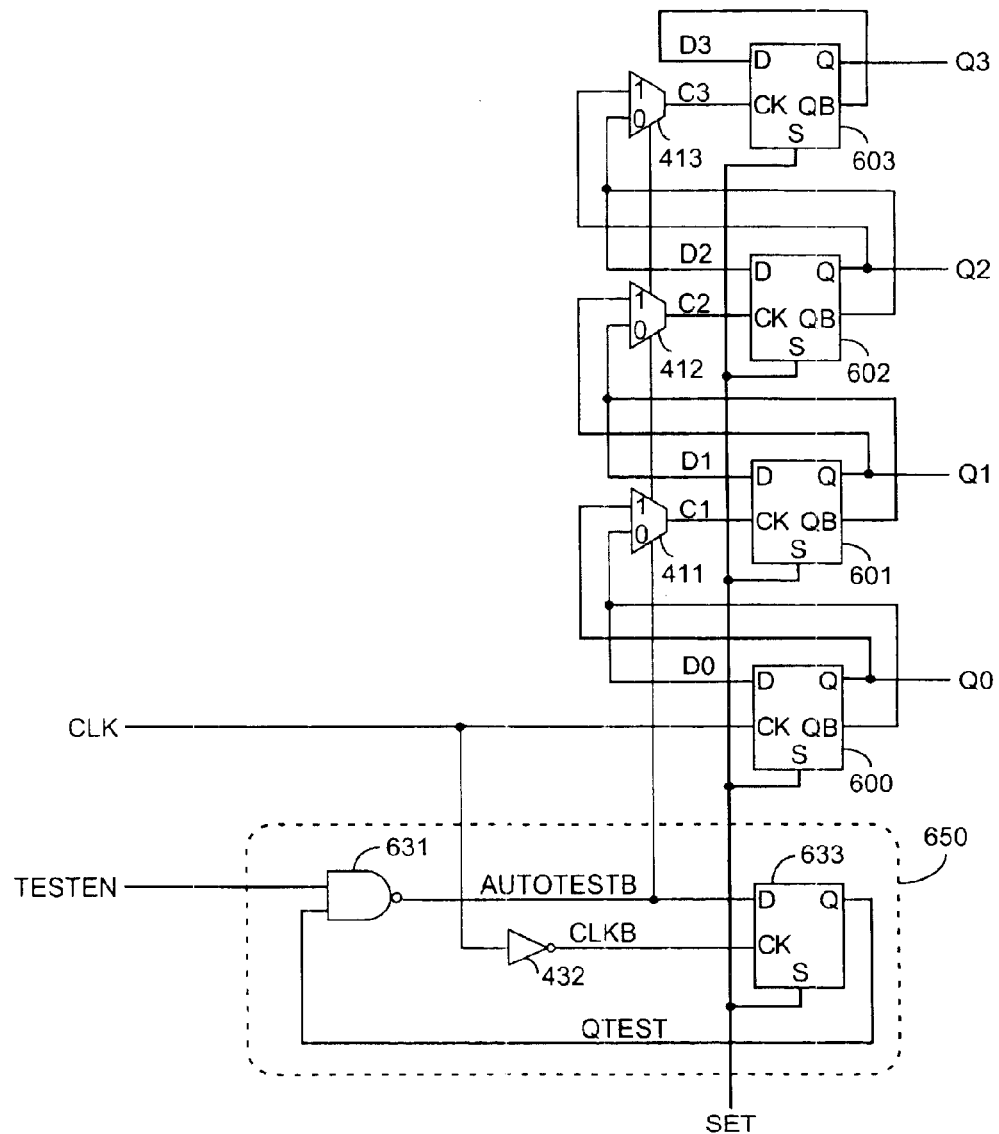
FIG. 6A is an alternative implementation of the testable ripple down counter circuit of FIG. 6.

FIG. 6A more clearly illustrates a ripple down counter circuit similar to that of FIG. 6. Reset flip-flops 433 and 400–403 (see FIG. 6) are replaced by set flip-flops 633 and 600–603. The Q outputs of flip-flops 600–603 now provide the output signals for the counter circuit. Inverter 430 and logical NOR gate 431 are replaced by logical NAND gate 631, which is driven by test enable input signal TESTEN and signal QTEST. Logical NAND gate 631 provides signal AUTOTESTB. In test mode (i.e., when signal TESTEN is high), a low value on signal AUTOTESTB places the circuit in the first test state, and a high value on signal AUTOTESTB places the circuit in the second test state.

Those of skill in the art can also easily extend the examples herein to implement up/down counters as well.

Figure 7:
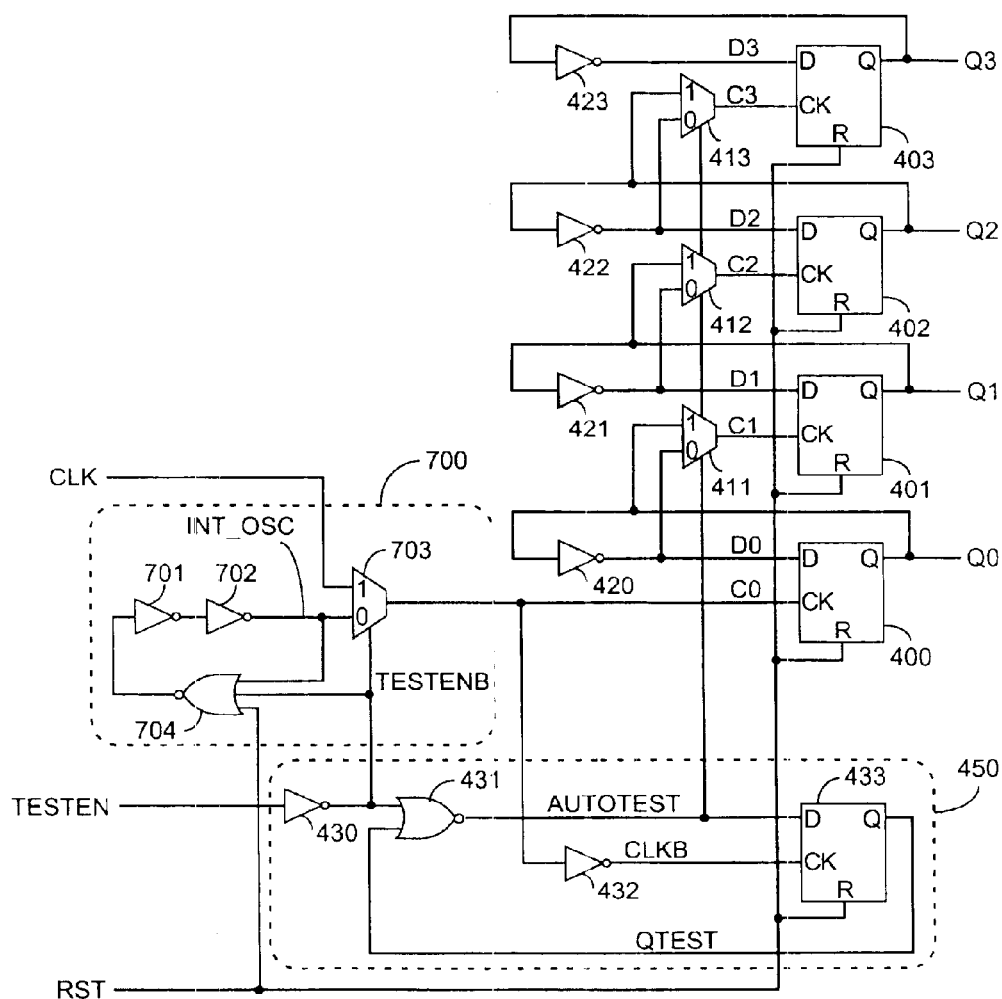
FIG. 7 illustrates a testable ripple up counter circuit including an oscillator circuit.
Figure 8:
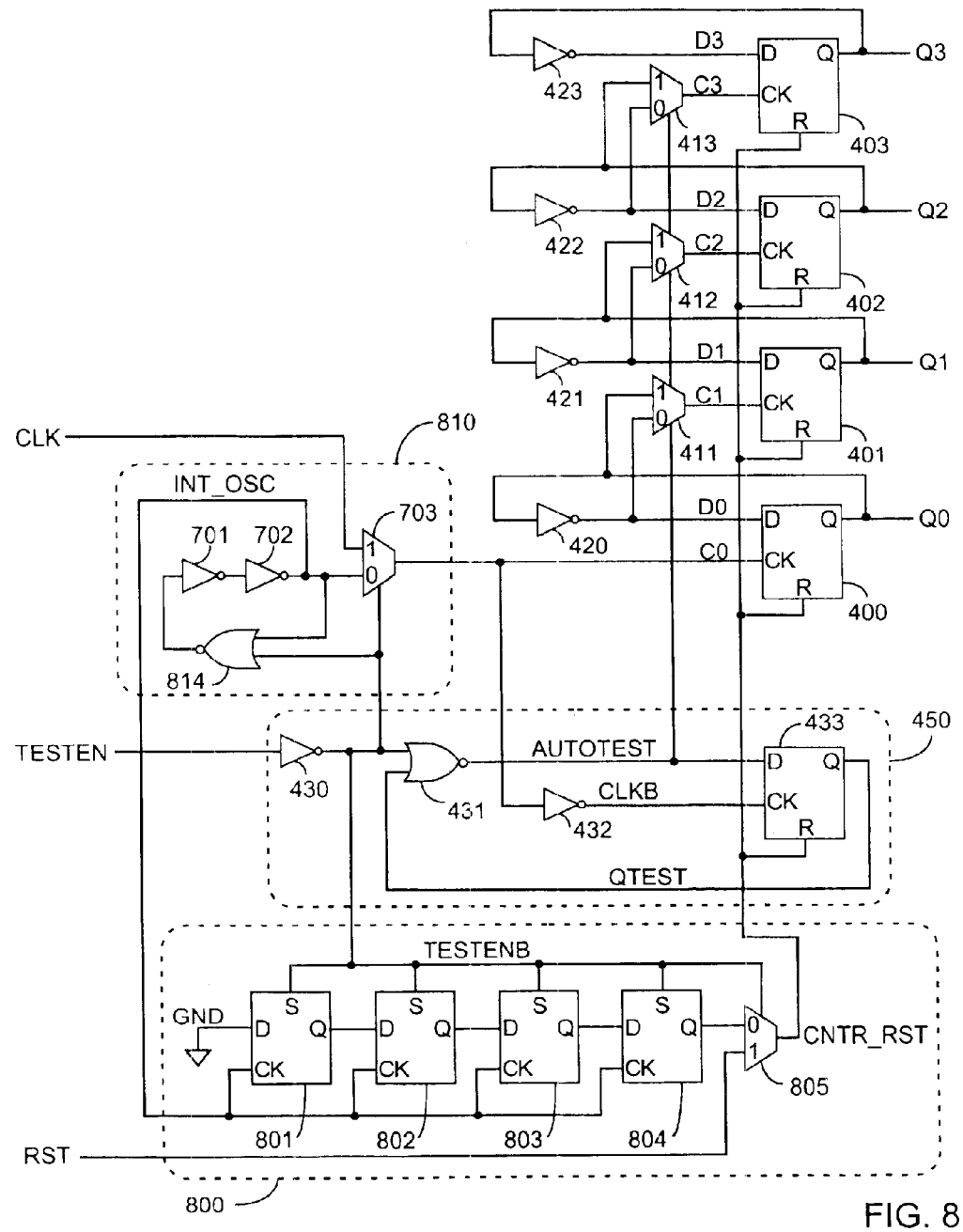
FIG. 8 illustrates a first testable ripple up counter circuit including an oscillator circuit and an initialization circuit.
Figure 9:
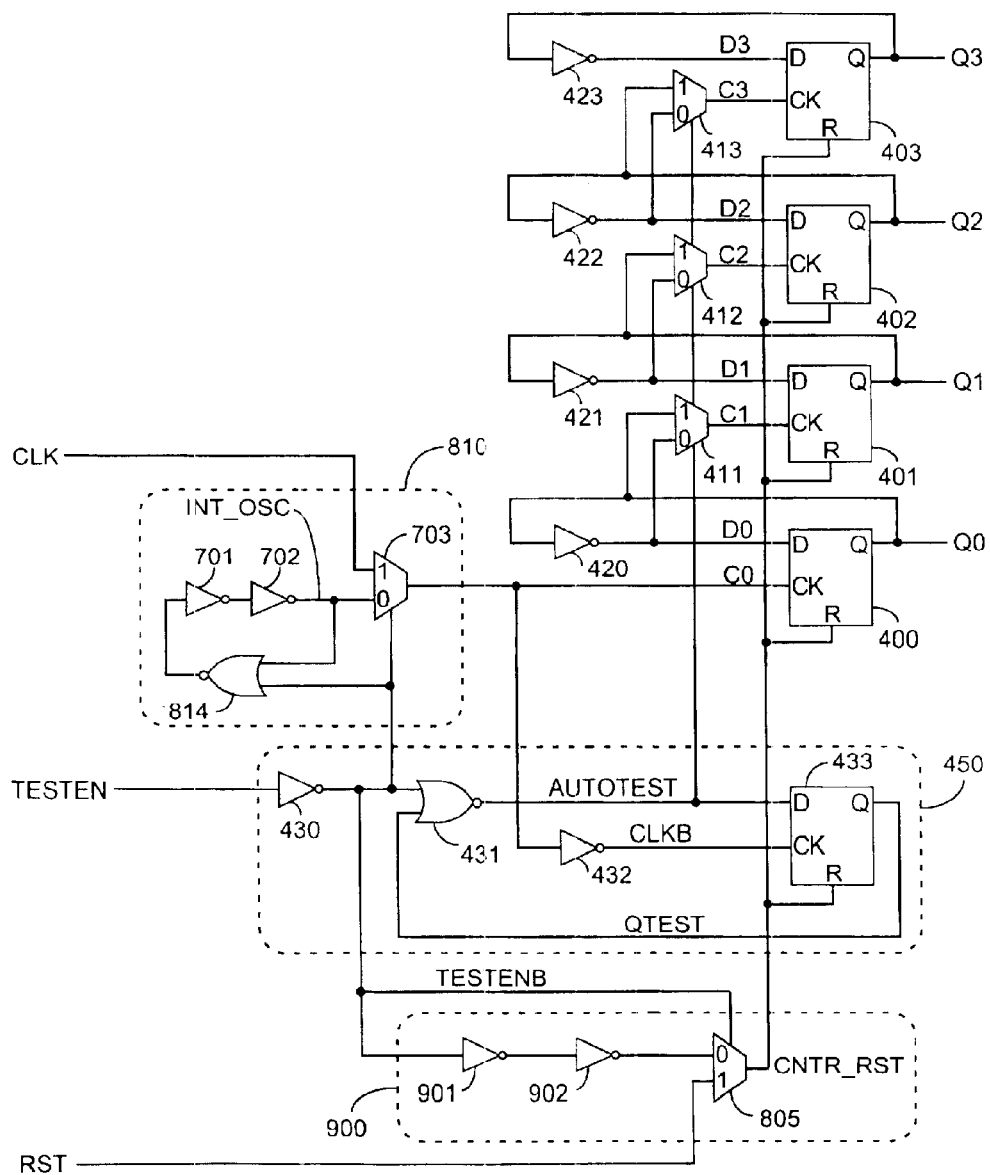
FIG. 9 illustrates a second testable ripple up counter circuit including an oscillator circuit and an initialization circuit.

FIGS. 7–9 illustrate exemplary ripple up counter circuits. However, those of skill in the relevant arts can easily extend these and other embodiments to implement ripple down counter circuits, e.g., as shown in FIGS. 6 and 6A or by using other known methods, and ripple up/down counter circuits.

FIG. 7 illustrates a testable ripple up counter circuit in which the control circuit generates its own internal clock signal. The embodiment of FIG. 7 is similar to that of FIG. 4 except for the addition of an oscillator circuit 700. Oscillator circuit 700 provides an internal clock signal INT_OSC. Note that the figures herein illustrate an exemplary embodiment of oscillator circuit 700. However, oscillator circuit 700 can be implemented in many different ways, and the invention is not limited to the exemplary implementation illustrated herein.

In the pictured embodiment, oscillator circuit 700 is implemented as a ring oscillator. (In other embodiments, other types of oscillators are used.) Oscillator circuit 700 includes inverters 701–702, logical NOR gate 704, and multiplexer 703. Inverters 701 and 702 are coupled in series. Inverter 702 provides signal INT_OSC, which drives the "0" input of multiplexer 703. The "1" input of multiplexer 703 is provided by signal CLK, and the select input is driven by signal TESTENB from inverter 430 of control circuit 450. The output terminal of multiplexer 703 provides the clock input signal C0 to flip-flop 400, and also drives inverter 432 of control circuit 450. Logical NOR gate 704 is driven by signals INT_OSC, TESTENB, and RST, and drives inverter 701.

Oscillator circuit 700 functions as follows. In test mode, signal TESTENB is low, and multiplexer 703 selects signal INT_OSC to drive the ripple counter clock input signal C0 instead of signal CLK. Thus, the ripple counter can be tested without clocking other circuits that might be driven by signal CLK. Additionally, the ripple counter can still be tested during a debugging procedure when signal CLK is not working properly.

FIG. 8 illustrates a testable ripple up counter circuit that generates its own internal reset signal, which goes away after a predetermined number of internal clock cycles. This function can be used, for example, to test the reset path used by signal RST, or to perform a reset function during a debugging procedure if the reset signal RST is not working properly. The embodiment of FIG. 8 is similar to that of FIG. 7, but includes an initialization circuit 800. In addition, note that in this embodiment reset signal RST is not used to reset the internal oscillator circuit 810. Therefore, 3-input logical NOR gate 704 of FIG. 7 is replaced by 2-input logical NOR gate 814 in FIG. 8.

In the pictured embodiment, initialization circuit 800 is a reset generator circuit, generating a reset initialization signal. In embodiments where the ripple counter is a down counter, the initialization circuit generates a set initialization signal. (Note that while FIGS. 8 and 9 illustrate exemplary initialization circuits, the invention is not limited to the exemplary implementations illustrated herein.)

Initialization circuit 800 includes a delay element comprising flip-flops 801–804 and a multiplexer 805. Flip-flops 801–804 are coupled in series, with a set S terminal of each flip-flop being coupled to receive signal TESTENB from control circuit 450, and each flip-flop 801–804 being clocked by signal INT_OSC from oscillator circuit 700. The data input terminal D of the first flip-flop 801 is coupled to ground GND. The data output terminal Q of the last flip-flop 804 is coupled to the "0" input terminal of multiplexer 805. The "1" input terminal of multiplexer 805 is coupled to receive signal RST, and the select terminal is coupled to receive signal TESTENB from control circuit 405. The output terminal CNTR_RST provides a reset signal to each flip-flop 400–403 in the ripple counter as well as to flip-flop 433 in control circuit 450.

Initialization circuit 800 functions as follows. Initially, all of flip-flops 801–804 are set, due to a high value on signal TESTENB. The high value on signal TESTENB also causes multiplexer 805 to select signal RST to provide a reset signal CNTR_RST to the ripple counter. When the circuit enters test mode, signal TESTENB goes low. Multiplexer 805 selects the value (now high) stored in flip-flop 804 as the reset signal CNTR_RST for the ripple counter. When signal INT_OSC goes high, a low value is clocked into flip-flop 801, the low value moving one flip-flop to the right with every subsequent rising edge of the internal clock signal INT_OSC. After four rising edges on signal INT_OSC, the low value appears in flip-flop 804 and is selected by multiplexer 805 as the reset signal CNTR_RST for the ripple counter. Therefore, the reset function goes away, and the values in flip-flops 400–403 are ready to function as described above.

If it is not necessary to test the clock circuitry, then oscillator circuit 810 can be omitted from the embodiment of FIG. 8. Instead of internal signal INT_OSC, signal CLK can be used to clock initialization circuit 800.

FIG. 9 illustrates another testable ripple up counter circuit similar to that of FIG. 8, but utilizing a smaller and simpler initialization circuit 900. Initialization circuit 900 includes a delay element (inverters 901 and 902, coupled in series) and a multiplexer 805. Multiplexer 805 is coupled as described in connection with FIG. 8. The simple delay element used in the embodiment of FIG. 9 merely delays the low value on signal TESTENB and provides the delayed low value to terminal "0" of multiplexer 805. Thus, the circuit of FIG. 9 behaves in a similar fashion to the circuit of FIG. 8, except that the delay prior to removing the reset signal is likely to be shorter. Notice also that oscillator circuit 700 is not used in initialization circuit 900. Therefore, the oscillator circuit can be omitted from this embodiment, if desired.

Figure 10:
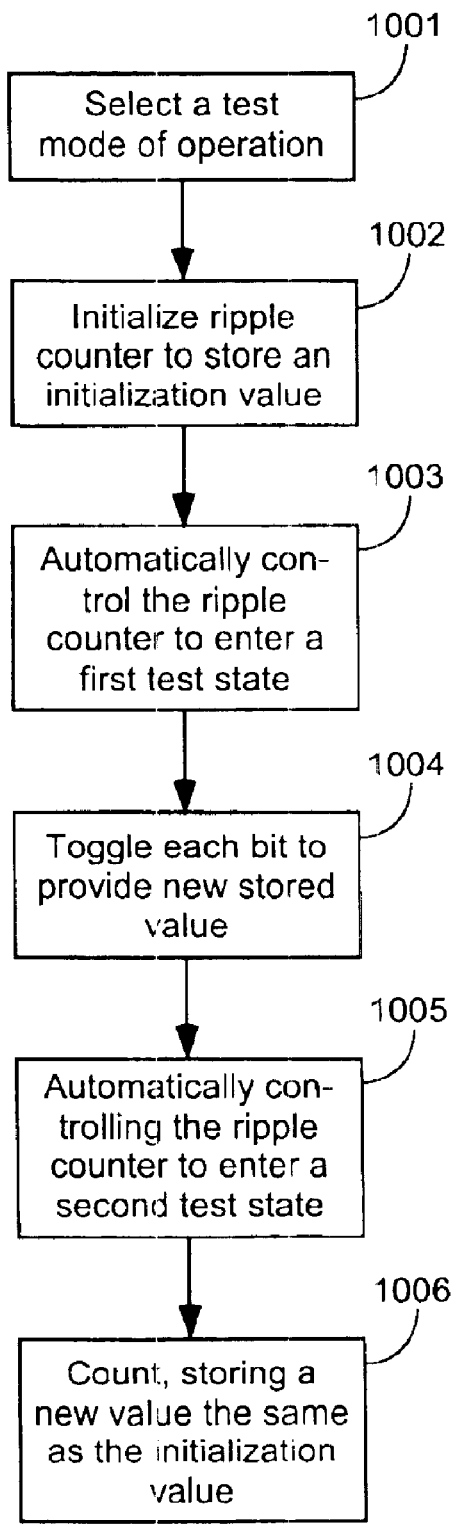
FIG. 10 illustrates the steps of an exemplary method of testing a ripple counter circuit, according to an embodiment of the present invention.

FIG. 10 illustrates the steps of a method of testing a ripple counter circuit, according to an embodiment of the present invention. The method of FIG. 10 can be implemented, for example, using any of the circuits illustrated in FIGS. 4–9.

In step 1001, a test mode of operation is selected for the ripple counter circuit. This step can be accomplished, for example, by placing a high value on signal TESTEN in the pictured embodiments.

In step 1002, the ripple counter circuit is initialized to store an initialization value. For example, when the ripple counter circuit includes an up counter, the initialization value can be an all zeros value. When the ripple counter circuit includes a down counter, the initialization value can be an all ones value. Steps 1001 and 1002 can occur in either order, or simultaneously.

In step 1003, the ripple counter circuit is automatically controlled to enter a first test state. For example, in the pictured embodiments a control circuit places a high value on signal AUTOTEST to enter the first test state.

In step 1004, each bit stored in the ripple counter circuit is toggled to provide a new stored value. For example, when the ripple counter circuit includes an up counter, the new stored value can be an all ones value. When the ripple counter circuit includes a down counter, the new stored value can be an all zeros value. The bits can toggle, for example, in response to a first edge (e.g., a rising edge) on an input clock signal.

In step 1005, the ripple counter circuit is automatically controlled to enter a second test state. For example, in the pictured embodiments a control circuit places a low value on signal AUTOTEST to enter the second test state. A low value on signal AUTOTEST effectively overrides the high value on signal TESTEN, as described above in regard to FIG. 4.

In step 1006, the ripple counter circuit counts in response to another first edge on an input clock signal. For example, the circuit can count up by one in response to a rising edge on signal CLK or signal INT_OSC, in the pictured embodiments.

The ripple counter circuits and methods of the invention have many practical applications. For example, the circuits shown and described herein can be used to quickly test programmable logic devices (PLDs) by implementing large ripple counter circuits using large amounts of programmable logic. Another application is in testing input/output (I/O) circuits. A ripple counter implemented in a series of programmable I/O circuits can be used to check the results of power supply and ground bounce when many I/O values are switching at almost the same time. Using conventional counter designs, many more clock cycles are required to test for power supply and ground bounce.

Those having skill in the relevant arts of the invention will now perceive various modifications and additions that can be made as a result of the disclosure herein. For example, the above text describes the circuits and methods of the invention in the context of ICs such as programmable logic devices (PLDs). However, the circuits of the invention can also be implemented in other electronic systems, for example, in printed circuit boards including discrete devices.

Further, storage elements, flip-flops, multiplexers, inverting elements, inverters, inverting logic gates, logical NOR gates, logical NAND gates, ripple counter circuits, ripple up counter circuits, ripple down counter circuits, control circuits, oscillator circuits, initialization circuits, delay elements, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A ripple counter circuit, comprising:

a clock input terminal;

a control circuit having a test enable input terminal, a clock input terminal coupled to the clock input terminal of the ripple counter circuit, and a control output terminal, wherein the control circuit controls a signal on the control output terminal to alternate between a first value and a! second value;

a first stage, comprising a first storage element having a data input terminal, a true data output terminal, a complement data output terminal, an initialization terminal, and a clock terminal, wherein the clock terminal is coupled to the clock input terminal of the ripple counter circuit, and wherein the complement data output terminal is coupled to the data input terminal; and a plurality of additional stages, each additional stage comprising an additional storage element having a data input terminal, a true data output terminal, a complement data output terminal, an initialization terminal, and a clock terminal, wherein the initialization terminal is coupled to the initialization terminal of the first storage element, and wherein the complement data output terminal is coupled to the data input terminal, and an additional multiplexer having an output terminal coupled to the clock terminal of the additional storage element, a first input terminal coupled to the true data output terminal of the storage element in a preceding stage, a second input terminal coupled to the complement data output terminal of the additional storage element in the preceding stage, and a select input terminal coupled to the control output terminal of the control circuit.

2. The ripple counter circuit of claim 1, wherein each of the first and the additional storage elements comprises a flip-flop having a true data output terminal and an inverting element coupled between the true data output terminal and the complement data output terminal of the storage element.

3. The ripple counter circuit of claim 1, wherein the ripple counter circuit comprises an up counter, and the initialization terminals of the first storage element and the additional storage elements are reset terminals.

4. The ripple counter circuit of claim 1, wherein the ripple counter circuit comprises a down counter, and the initialization terminals of the first storage element and the additional storage elements are set terminals.

5. The ripple counter circuit of claim 1, wherein the control circuit comprises:
   a second storage element having a data input terminal, a data output terminal, and a clock input terminal coupled to the clock input terminal of the ripple counter circuit; and
   an inverting logic gate having a first input terminal coupled to the data output terminal of the second storage element, a second input terminal coupled to the test enable input terminal, and an output terminal coupled to the data input terminal of the second storage element and further coupled to the control output terminal of the control circuit.

6. The ripple counter circuit of claim 5, further comprising an inverter coupled between the clock input terminal of the ripple counter circuit and the clock input terminal of the second storage element.

7. The ripple counter circuit of claim 5, wherein the inverting logic gate comprises a logical NOR gate.

8. The ripple counter circuit of claim 5, wherein the second storage element comprises a D-type flip-flop.

9. The ripple counter circuit of claim 1, further comprising:
   an oscillator having an output terminal; and
   a clock select multiplexer having a first input terminal coupled to the clock input terminal of the ripple counter circuit, a second input terminal coupled to the output terminal of the oscillator, a select terminal coupled to the test enable input terminal of the control circuit, and an output terminal coupled to the clock terminal of the first storage element.

10. The ripple counter circuit of claim 9, wherein the oscillator comprises a ring oscillator.

11. The ripple counter circuit of claim 1, wherein the control circuit comprises an initialization terminal coupled to the initialization terminals of the first storage element and the additional storage elements.

12. The ripple counter circuit of claim 11, wherein the ripple counter circuit further comprises an initialization circuit having an initialization output terminal coupled to the initialization terminals of the first storage element, the additional storage elements, and the control circuit.

13. The ripple counter circuit of claim 12, wherein the initialization output terminal of the initialization circuit comprises a reset output terminal.

14. The ripple counter circuit of claim 12, wherein the ripple counter circuit further comprises an initialization input terminal, the initialization circuit comprising:
   a delay element having an input terminal and an output terminal; and
   an initialization multiplexer having a first input terminal coupled to the initialization input terminal of the ripple counter circuit, a second input terminal coupled to the output terminal of the delay element, a select terminal coupled to the test enable input terminal of the control circuit, and an output terminal coupled to the initialization output terminal of the initialization circuit.

15. The ripple counter circuit of claim 14, wherein the delay element comprises a plurality of flip-flops coupled in series, a first flip-flop of the series having a data input terminal coupled to ground and a last flip-flop of the series having a data output terminal coupled to the output terminal of the delay element.

16. The ripple counter circuit of claim 14, wherein the delay element comprises a plurality of inverting logic gates coupled in series.

17. A method of testing a ripple counter circuit, comprising:
   selecting a test mode of operation for the ripple counter circuit;
   initializing the ripple counter circuit to store an initialization value;
   automatically controlling the ripple counter circuit to enter a first state when in the test mode;
   toggling, in the first state, each bit stored in the ripple counter circuit to provide a new stored value;
   automatically controlling the ripple counter circuit to enter a second state when in the test mode; and
   counting, in the second state, in response to a first edge on a clock input signal, wherein the ripple counter circuit stores a new value the same as the initialization value.

18. The method of claim 17, wherein the first edge on the clock input signal is a rising edge.

19. The method of claim 17, wherein toggling each bit stored in the ripple counter circuit comprises toggling the bits on receipt of another first edge on the clock input signal.

20. The method of claim 17, wherein selecting a test mode of operation comprises providing a value on a test enable input signal, and automatically controlling the ripple counter circuit to enter a second state comprises overriding the value on the test enable input signal.

21. The method of claim 17, wherein the initialization value is an all zeros value, the new stored value is an all ones value, and counting in response to a first edge on a clock input signal comprises adding one to the new stored value.

22. The method of claim 17, wherein the initialization value is an all ones value, the new stored value is an all zeros value, and counting in response to a first edge on a clock input signal comprises subtracting one from the new stored value.

23. A ripple counter circuit, comprising:
   means for selecting a test mode of operation for the ripple counter circuit;
   means for initializing the ripple counter circuit to store an initialization value;
   means for controlling the ripple counter circuit to automatically enter a first state followed by a second state when in the test mode;
   means for toggling, in the first state, each bit stored in the ripple counter circuit to provide a new stored value; and
   means for counting, in the second state, in response to a first edge on a clock input signal, wherein the ripple counter circuit stores a new value the same as the initialization value.

24. The ripple counter circuit of claim 23, wherein the first edge on the clock input signal is a rising edge.

25. The ripple counter circuit of claim 23, wherein the means for toggling each bit stored in the ripple counter circuit comprises means for toggling the bits on receipt of another first edge on the clock input signal.

26. The ripple counter circuit of claim 23, wherein the means for selecting a test mode of operation comprises a test enable input signal, and the means for controlling the ripple counter circuit to automatically enter a first state followed by a second state comprises means for overriding the value on the test enable input signal when in the second state.

27. The ripple counter circuit of claim 23, wherein the initialization value is an all zeros value, the new stored value is an all ones values, and the means for counting in response to a first edge on a clock input signal comprises means for adding one to the new stored value.

28. The ripple counter circuit of claim 23, wherein the initialization value is an all ones value, the new stored value is an all zeros value, and the means for counting in response to a first edge on a clock input signal comprises means for subtracting one from the new stored value.

* * * * *